(12) United States Patent
Sugawara et al.

(10) Patent No.: US 11,488,833 B2
(45) Date of Patent: Nov. 1, 2022

(54) METHOD OF MANUFACTURING SEMICONDUCTOR DEVICE

(71) Applicants: SUMITOMO ELECTRIC INDUSTRIES, LTD., Osaka (JP); TOHOKU UNIVERSITY, Miyagi (JP)

(72) Inventors: Kenta Sugawara, Osaka (JP); Seiji Samukawa, Miyagi (JP); Daisuke Ohori, Miyagi (JP)

(73) Assignees: SUMITOMO ELECTRIC INDUSTRIES, LTD., Osaka (JP); TOHOKU UNIVERSITY, Miyagi (JP)

( * ) Notice: Subject to any disclaimer, the term of this patent is extended or adjusted under 35 U.S.C. 154(b) by 157 days.

(21) Appl. No.: 17/158,382

(22) Filed: Jan. 26, 2021

(65) Prior Publication Data

US 2021/0257219 A1      Aug. 19, 2021

(30) Foreign Application Priority Data

Feb. 19, 2020   (JP) .............................. JP2020-026568

(51) Int. Cl.
| | | |
|---|---|---|
| H01L 21/02 | (2006.01) | |
| H01L 21/28 | (2006.01) | |
| H01L 21/285 | (2006.01) | |
| H01L 21/311 | (2006.01) | |
| H01L 29/66 | (2006.01) | |

(52) U.S. Cl.
CPC .... *H01L 21/31116* (2013.01); *H01L 21/0217* (2013.01); *H01L 21/0254* (2013.01); *H01L 21/28* (2013.01); H01L 29/66462 (2013.01)

(58) Field of Classification Search
CPC .......... H01L 21/31116; H01L 21/0217; H01L 21/0254; H01L 21/28; H01L 29/66462; H01L 21/28575; H01L 21/28581; H01L 21/28587; H01L 29/2003; H01L 29/41766;
(Continued)

(56) References Cited

U.S. PATENT DOCUMENTS

2016/0211145 A1    7/2016  Gu et al.

FOREIGN PATENT DOCUMENTS

| JP | 2014-060268 | 4/2014 |
| JP | 2016-134519 | 7/2016 |

OTHER PUBLICATIONS

"High-Performance GaN MOSHEMTs Fabricated With ALD Al2O3 Dielectric and NBE Gate Recess Technology for High Frequency Power Applications", Yen-Ku Lin et al., IEEE Electron Device Letters, vol. 38, No. 6, Jun. 2017, p. 771-774.

*Primary Examiner* — David Vu
(74) *Attorney, Agent, or Firm* — IPUSA, PLLC

(57) ABSTRACT

A method of manufacturing a semiconductor device including a substrate; a first nitride layer containing gallium on the substrate; and a second nitride layer containing silicon on the first nitride layer includes generating an etchant of a gas containing chlorine atoms or bromine atoms; and selectively removing the second nitride layer, wherein the etchant is generated by plasma discharge of the gas, wherein the second nitride layer and the first nitride layer are prevented from being irradiated with ultraviolet rays generated at a time of the plasma discharge, and wherein the selectively removing the second nitride layer includes etching the second nitride layer under a first atmosphere at a first pressure that is lower than a first saturated vapor pressure of a silicon compound and that is higher than a second saturated vapor pressure of a gallium compound.

11 Claims, 12 Drawing Sheets

(58) Field of Classification Search
CPC .............. H01L 29/7787; H01L 21/3065; H01J 37/32357; H01J 37/32422; H01J 37/32651
See application file for complete search history.

METHOD OF MANUFACTURING SEMICONDUCTOR DEVICE

CROSS-REFERENCE TO RELATED APPLICATION

The present application is based upon and claims priority to Japanese Patent Application No. 2020-026568, filed on Feb. 19, 2020, the entire contents of which are incorporated herein by reference.

BACKGROUND OF THE INVENTION

1. Field of the Invention

The present disclosure relates to a method of manufacturing a semiconductor device.

2. Description of the Related Art

As a type of semiconductor device, a high electron mobility transistor (HEMT) using a gallium nitride (GaN)-based nitride semiconductor is known. In manufacturing a HEMT using a GaN-based nitride semiconductor (which may be referred to as a GaN-HEMT hereinafter), a protective film of silicon nitride (SiN) is formed on the nitride semiconductor layer, an opening is formed in the protective film by etching using plasma of fluorine-based gas, and a gate electrode is formed in the opening (for example, Patent Document 1).

PRIOR ART DOCUMENTS

Patent Documents

[Patent Document 1] Japanese Laid-open Patent Publication No. 2014-60268
[Patent Document 2] Japanese Laid-open Patent Publication No. 2016-134519

Non-Patent Document

[Non-Patent Document 1] IEEE ELECTRON DEVICE LETTERS, VOL. 38, NO. 6, JUNE 2017, P771-774

SUMMARY OF THE INVENTION

In a GaN-HEMT manufactured by etching using plasma of fluorine-based gas, fluorine easily remains in the nitride semiconductor layer. A residue of fluorine in the nitride semiconductor layer may cause deterioration of electrical properties due to fluctuation in threshold voltage or the like.

On the other hand, it is expected that a cap layer and an electron supply layer contained in a nitride semiconductor layer become thinner as the frequency of a GaN-HEMT increases. Except etching using plasma of fluorine-based gas, it is difficult to form an opening in a protective film on the cap layer and the electron supply layer, which are made thinner, at a high etching selectivity ratio. The etching selectivity ratio in the present disclosure refers to the ratio of the rate of etching performed earlier to the rate of etching performed later when two objects are successively etched under substantially the same conditions.

It is an object of the present disclosure to provide a method of manufacturing a semiconductor device that can enhance the etching selectivity ratio of a nitride layer containing silicon to a nitride layer containing gallium without the use of a fluorine-based gas.

According to the present disclosure, a method of manufacturing a semiconductor device including a substrate; a first nitride layer containing gallium on the substrate; and a second nitride layer containing silicon on the first nitride layer, includes: generating an etchant of a gas containing chlorine atoms or bromine atoms; and selectively removing the second nitride layer with respect to the first nitride layer by the etchant, wherein in the generating the etchant, the etchant is generated by plasma discharge of the gas, wherein in the selectively removing the second nitride layer, the second nitride layer and the first nitride layer are prevented from being irradiated with ultraviolet rays generated at a time of the plasma discharge, and wherein the selectively removing the second nitride layer includes etching the second nitride layer under a first atmosphere at a first pressure that is lower than a first saturated vapor pressure of a silicon compound containing silicon atoms and chlorine atoms or bromine atoms contained in the gas and that is higher than a second saturated vapor pressure of a gallium compound containing gallium atoms and chlorine atoms or bromine atoms contained in the gas.

According to the present disclosure, it is possible to provide a method of manufacturing a semiconductor device that can enhance the etching selectivity ratio of a nitride layer containing silicon to a nitride layer containing gallium without the use of a fluorine-based gas.

DESCRIPTION OF THE PREFERRED EMBODIMENTS

Figure 1:
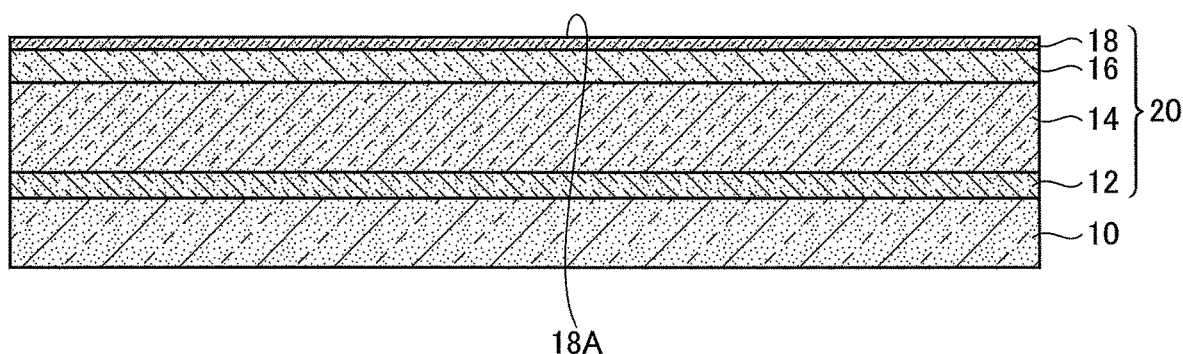
FIG. 1 is a cross-sectional view (part 1) illustrating a method of manufacturing a semiconductor device according to an embodiment.

In the following, an embodiment for carrying out will be described.

Description of Embodiment of the Present Disclosure

To begin with, aspects of the present disclosure are listed and described below. In the following description, the same reference characters are allotted to the same or corresponding elements and the same descriptions thereof are not repeated.

<1> According to one aspect of the present disclosure, a method of manufacturing a semiconductor device including a substrate; a first nitride layer containing gallium on the substrate; and a second nitride layer containing silicon on the first nitride layer includes: generating an etchant of a gas containing chlorine atoms or bromine atoms; and selectively removing the second nitride layer with respect to the first nitride layer by the etchant, wherein in the generating the etchant, the etchant is generated by plasma discharge of the gas, wherein in the selectively removing the second nitride layer, the second nitride layer and the first nitride layer are prevented from being irradiated with ultraviolet rays generated at a time of the plasma discharge, and wherein the selectively removing the second nitride layer includes etching the second nitride layer under a first atmosphere at a first pressure that is lower than a first saturated vapor pressure of a silicon compound containing silicon atoms and chlorine atoms or bromine atoms contained in the gas and that is higher than a second saturated vapor pressure of a gallium compound containing gallium atoms and chlorine atoms or bromine atoms contained in the gas.

In order to solve the above problem, the inventors of the present application have investigated the use of a chlorine-based gas or a bromine-based gas instead of a fluorine-based. It was found that a sufficient etching selectivity ratio cannot be obtained by simply changing the gas. Then, the inventors of the present application have conducted earnest investigation in order to find the reason why a sufficient etching selectivity ratio cannot be obtained in a case in which a chlorine-based gas or a bromine-based gas is used. As a result, it was found that ultraviolet rays are generated when the plasma of a chlorine-based gas or a bromine-based gas is generated, and not only etchant but also ultraviolet rays reach a nitride layer containing Ga, resulting in the generation of an uncontrollable compound. Furthermore, it was found that due to the vaporization of this compound, the nitride layer containing Ga is etched.

Accordingly, in the present disclosure, in the selectively removing the second nitride layer, irradiation with ultraviolet rays are prevented, and the second nitride layer is etched under the first atmosphere at the first pressure that is lower than the first saturated vapor pressure and that is higher than the second saturated vapor pressure. Thereby, the generation of an uncontrollable compound as described above is suppressed, the first nitride layer is not easily etched at the time of etching of the second nitride layer, and the etching selectivity ratio of the second nitride layer to the first nitride layer can be enhanced.

<2> According to <1>, when the gas contains chlorine atoms, the gallium compound may be $GaCl_3$ (gallium (III) chloride). In this case, a high etching selectivity ratio is obtained based on the second saturated vapor pressure of $GaCl_3$.

<3> According to <1>, when the gas contains bromine atoms, the gallium compound may be $GaBr_3$ (gallium (III) bromide). In this case, a high etching selectivity ratio is obtained based on the second saturated vapor pressure of $GaBr_3$.

<4> According to any one of <1> to <3>, the first pressure may be set to 0.1 Pa or more and 10 Pa or less in the selectively removing the second nitride layer. In this case, the etchant of a gas containing chlorine atoms or bromine atoms is easily generated.

<5> According to any one of <1> to <4>, the generating the etchant may include generating particles charged by the plasma discharge of the gas; and electrically neutralizing the particles. In this case, the kinetic energy of the particles can be properly controlled to obtain a higher etching selectivity ratio.

<6> According to <5>, the generating the etchant may include controlling a moving direction of the electrically neutralized particles by a filter. In this case, the kinetic energy of the particles can be properly controlled to obtain a higher etching selectivity ratio.

<7> According to any one of <1> to <6>, in the selectively removing the second nitride layer, the gallium compound may be generated on a surface of the first nitride layer on the second nitride layer side subsequent to the etching the second nitride layer, and the selectively removing the second nitride layer may include removing the gallium compound under a second atmosphere at a second pressure that is lower than the second saturated vapor pressure. In this case, the gallium compound unnecessary for a semiconductor device can be easily removed.

<8> According to any one of <1> to <7>, the selectively removing the second nitride layer may include forming an opening on the second nitride layer where the first nitride layer is exposed. In this case, an electrode or the like can be formed later in the opening.

<9> According to <8>, the method may further include forming, in the opening, an electrode that contacts the first nitride layer. The electrode can be used, for example, as a gate electrode.

<10> According to any one of <1> to <9> a thickness of the second nitride layer may be 100 nm or less before the selectively removing the second nitride layer. In this case, it is possible to obtain high output at high frequency.

<11> According to another one aspect of the present disclosure, a method of manufacturing a semiconductor device includes: forming a first nitride layer containing gallium on a substrate; forming a second nitride layer containing silicon on the first nitride layer; generating an etchant of a gas containing chlorine atoms or bromine atoms; selectively removing the second nitride layer with respect to the first nitride layer by the etchant and forming an opening on the second nitride layer where the first nitride layer is exposed; and forming, in the opening, an electrode that contacts the first nitride layer, wherein the generating the etchant includes generating particles charged by the plasma discharge of the gas; and electrically neutralizing the particles; and controlling a moving direction of the electrically neutralized particles by a filter, wherein in the selectively removing the second nitride layer, the second nitride layer and the first nitride layer are prevented by the filter from being irradiated with ultraviolet rays generated at a time of the plasma discharge, and wherein the selectively removing the second nitride layer includes etching the second nitride layer under a first atmosphere at a first pressure that is lower than a first saturated vapor pressure of $SiCl_4$ or $SiBr_4$ containing silicon atoms and chlorine atoms or bromine atoms contained in the gas and that is higher than a second saturated vapor pressure of $GaCl_3$ or $GaBr_3$ containing gallium atoms and chlorine atoms or bromine atoms contained in the gas; and removing, under a second atmosphere at a second pressure that is lower than the second saturated vapor pressure, $GaCl_3$ or $GaBr_{3g}$ generated on a surface of the first nitride layer on the second nitride layer side subsequent to the etching the second nitride layer.

Thereby, the generation of an uncontrollable compound as described above is suppressed, the first nitride layer is not easily etched at the time of etching of the second nitride layer, and the etching selectivity ratio of the second nitride layer to the first nitride layer can be enhanced.

Embodiment of the Present Disclosure

The present embodiment relates to a method of manufacturing a semiconductor device including a GaN-HEMT with nitride semiconductors as the main constituent material. FIG. 1 to FIG. 7 are cross-sectional views illustrating a method of manufacturing a semiconductor device according to an embodiment.

First, as illustrated in FIG. 1, a layered structure 20 including a plurality of nitride semiconductor layers is grown on a substrate 10 using a metal-organic chemical vapor deposition (MOCVD) method. The substrate 10 is, for example (0001) a SiC substrate having a (0001) principal surface, and the layered direction of the layered structure 20 is a <0001> direction, for example. The layered structure 20 includes a nucleation layer 12, an electron transport layer 14, an electron supply layer 16, and a cap layer 18 that are sequentially formed from the substrate 10 side. The nucleation layer 12 is, for example, an AlN layer having a thickness of several tens of nm. The electron transport layer 14 is, for example, an undoped GaN layer having a thickness of 1000 nm. The electron supply layer 16 is, for example, an n-type AlGaN layer having a thickness of 20 nm. The cap layer 18 is, for example, an n-type GaN layer having a thickness of 5 nm. The cap layer 18 has an upper surface 18A.

Figure 2:
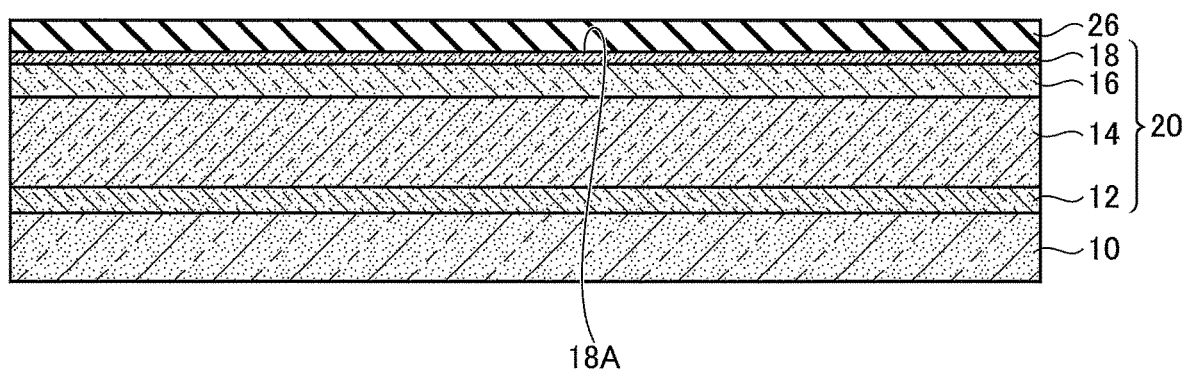
FIG. 2 is a cross-sectional view (part 2) illustrating the method of manufacturing a semiconductor device according to the embodiment.

Next, as illustrated in FIG. 2, a protective film 26 that contacts the upper surface of the layered structure 20 is deposited using a plasma CVD method. The protective film 26 is, for example, a SiN film having a thickness of 100 nm. The deposition temperature of the protective film 26 is, for example, 200° C. to 400° C. Also, for example, ammonia gas and silane ($SiH_4$) are used as the raw material gas for the protective film 26.

Figure 3:
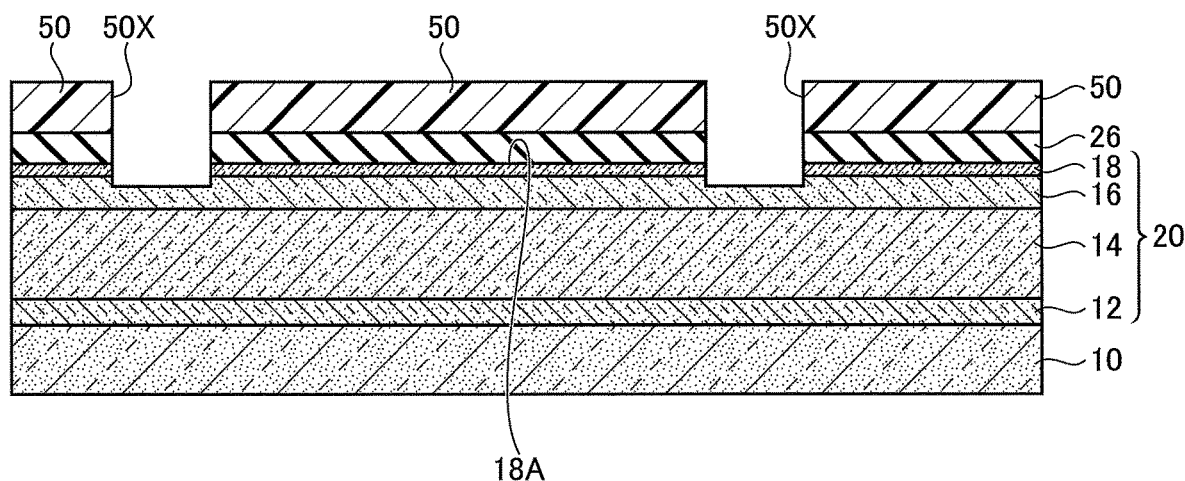
FIG. 3 is a cross-sectional view (part 3) illustrating the method of manufacturing a semiconductor device according to the embodiment.

Subsequently, as illustrated in FIG. 3, a photoresist 50 is applied over the protective film 26. By photolithography, openings 50X are formed in the photoresist 50. By reactive ion etching (RIE) using a reactive gas containing fluorine (F) atoms with the photoresist 50 as a mask, the openings are formed in the protective film 26 and the cap layer 18. The photoresist 50 is then removed.

Figure 4:
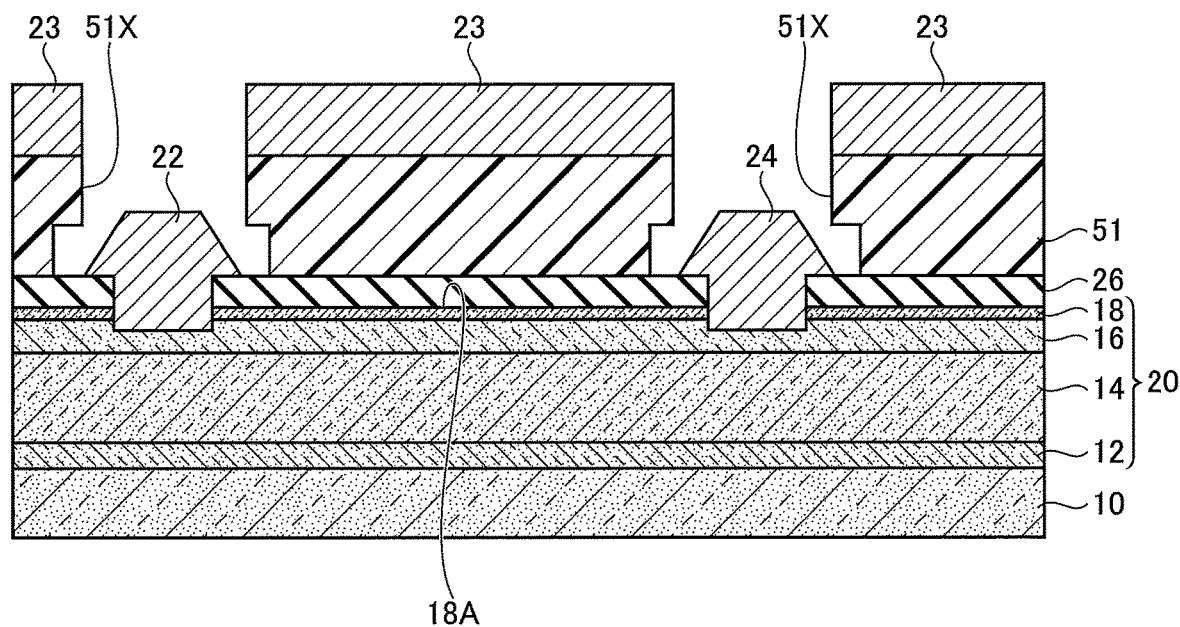
FIG. 4 is a cross-sectional view (part 4) illustrating the method of manufacturing a semiconductor device according to the embodiment.

Subsequently, another photoresist 51 is applied over the protective film 26, as illustrated in FIG. 4. Openings 51X in the photoresist 51 are formed on the openings in the protective film 26 by photolithography. The openings 51X formed in the photoresist 51 are wider than the openings 50X formed in the photoresist 50 described above.

A source electrode 22 and a drain electrode 24 that are in contact with the electron supply layer 16 through the openings in the protective film 26 are then formed using a vapor deposition method. The source electrode 22 and the drain electrode 24 both include a Ti film and an Al film. For example, the film thickness of the Ti film is 30 nm and the film thickness of the Al film is 300 nm. A Ta film may be used instead of a Ti film. A metal 23 is deposited on the photoresist 51. The metal 23 on the photoresist 51 is then removed by removing the photoresist 51. This forms the source electrode 22 and the drain electrode 24 that are in contact with the electron supply layer 16. For example, the Ti film (or the Ta film) and the Al film are alloyed by a heat treatment at 500° C. to form the source electrode 22 and the drain electrode 24 that are in contact with the electron supply layer 16. An alloy temperature greater than or equal to 550° C. further contributes to lower the contact resistance.

Figure 5:
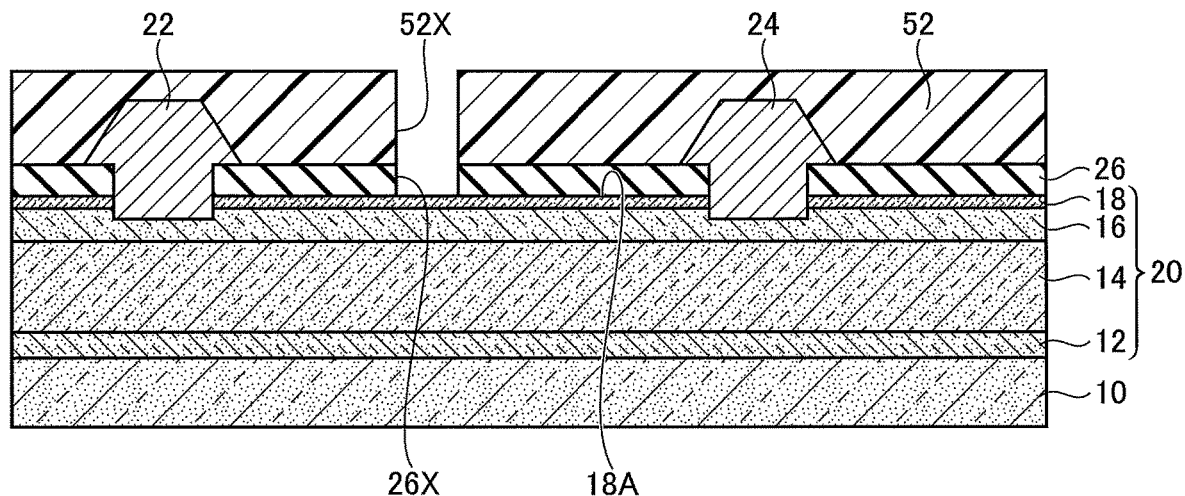
FIG. 5 is a cross-sectional view (part 5) illustrating the method of manufacturing a semiconductor device according to the embodiment.

Another photoresist 52 is then applied over the layered structure 20, as illustrated in FIG. 5. By photolithography, an opening 52X is formed in the photoresist 52. The protective film 26 is then selectively removed with the photoresist 52 as a mask. That is, a portion of the protective film 26 is removed in the direction parallel to the main surface of the substrate 10. As a result, the opening 26X is formed in the protective film 26. The opening 26X is formed to reach the cap layer 18. That is, the opening 26X through which the cap layer 18 is exposed is formed on the protective film 26. The photoresist 52 is then removed. Details of the method of selectively removing the protective film 26 will be described later.

Figure 6:
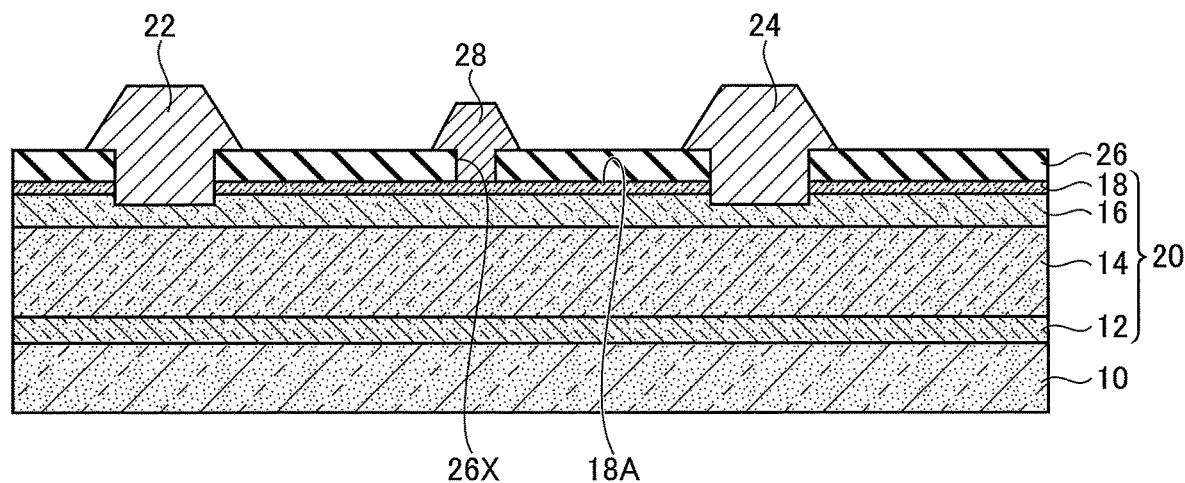
FIG. 6 is a cross-sectional view (part 6) illustrating the method of manufacturing a semiconductor device according to the embodiment.

Subsequently, a photoresist is applied over the layered structure 20. An opening to be a gate electrode pattern is formed in the photoresist by photolithography. A vapor deposition method is used to form a gate electrode 28 that contacts the cap layer 18, as illustrated in FIG. 6. The gate electrode 28 includes a Ni film and an Au film from the layered structure 20 side. The film thickness of the Ni film is, for example, 50 nm and the film thickness of the Au film is, for example, 400 nm. As the vapor deposition method, various methods such as an electron beam (EB) vapor deposition method, a sputtering vapor deposition method, and a resistance heating vapor deposition method can be used. The metal deposited on the photoresist is removed with the photoresist.

Figure 7:
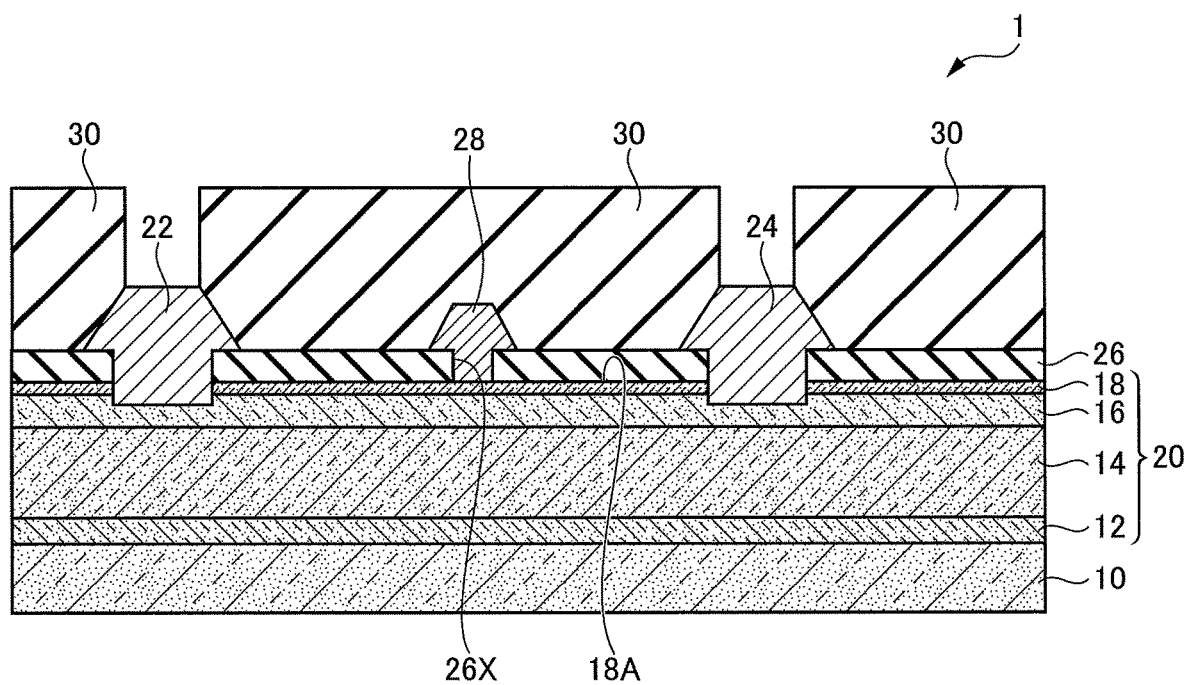
FIG. 7 is a cross-sectional view (part 7) illustrating the method of manufacturing a semiconductor device according to the embodiment.

Subsequently, as illustrated in FIG. 7, an insulating film 30 is formed on the protective film 26 by a plasma enhanced chemical vapor deposition (PECVD) method, for example, and the gate electrode 28 is covered by the insulating film 30. The insulating film 30 is, for example, a SiN film having a thickness of 500 nm. Openings 30X are formed in the insulating film 30 by etching using a buffered hydrofluoric acid to expose the source electrode 22 and the drain electrode 24.

Thereafter, wiring or the like is formed as necessary. In this manner, a semiconductor device 1 including GaN-HEMT can be manufactured.

Figure 8:
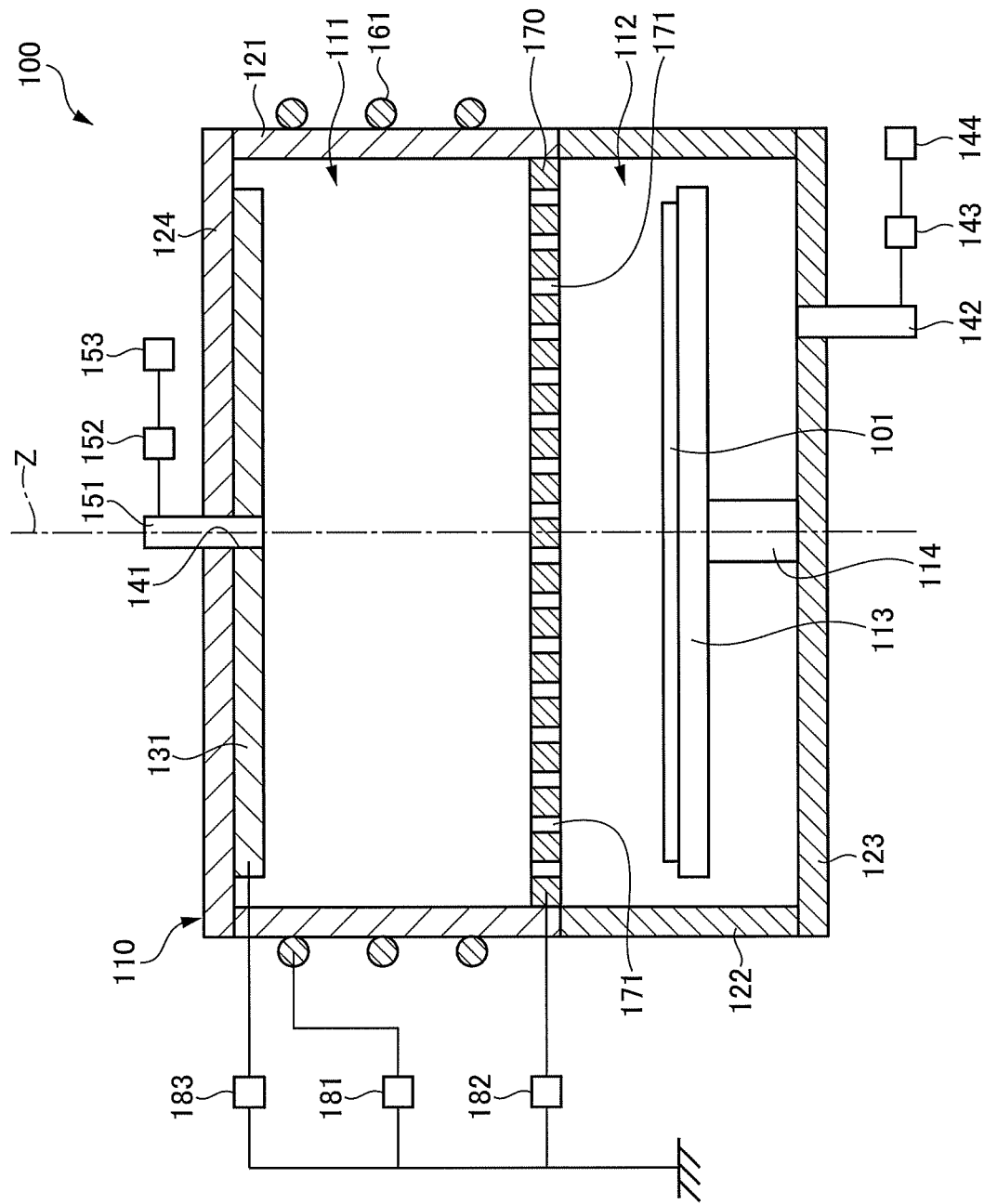
FIG. 8 is a schematic diagram illustrating an etching apparatus suitable for removing a protective film.

Next, a method of removing and forming the protective film 26 will be described in detail. Here, an etching apparatus suitable for forming the opening 26X will be first described, and then a method of forming the opening 26X using the etching apparatus will be described. FIG. 8 is a schematic diagram illustrating an etching apparatus suitable for removal of the protective film 26. FIG. 8 schematically illustrates a longitudinal cross-section of the etching apparatus.

The etching apparatus 100 includes a processing container 110. The processing container 110 is a substantially cylindrical container extending in the direction in which the axis Z extends (hereinafter referred to as the "axis Z direction"), and forms a space therein. This space includes a plasma generation chamber 111 and a processing chamber 112 that is located below the plasma generation chamber 111.

The processing container 110 has a first sidewall 121, a second sidewall 122, a bottom portion 123 and a lid portion 124. For example, the first sidewall 121, the second sidewall 122, the bottom portion 123, and the lid portion 124 are grounded.

The first sidewall 121 has a substantially cylindrical shape extending in the axis Z direction and forms the plasma generation chamber 111. The upper end of the first sidewall 121 is open. The lid portion 124 is provided on the first sidewall 121 to close the opening of the first sidewall 121. A disk-shaped electrode plate 131 is attached to the lower surface of the lid portion 124. On the lid portion 124 and the electrode plate 131, a hole 141 is formed to penetrate the lid portion 124 and the electrode plate 131 along the axis Z, and a pipe 151 is inserted in the hole 141 to be connected to the plasma generation chamber 111.

A gas source 153 is connected to the pipe 151 via a flow controller 152 or the like. The gas source 153 is a supply source of a first gas containing chlorine atoms or bromine atoms. According to the etching apparatus 100, the first gas can be supplied from the gas source 153 to the plasma generation chamber 111.

A coil 161 is wound around the outer periphery of the first sidewall 121. One end of the coil 161 is connected to the ground and the other end of the coil 161 is connected to a high frequency power supply 181. In the etching apparatus 100, an inductive magnetic field can be generated in the plasma generation chamber 111 by supplying electric power to the coil 161 from the high frequency power supply 181. By this inductive magnetic field, the gas supplied in the plasma generation chamber 111 can be excited and plasma can be generated in the plasma generation chamber 111.

The second sidewall 122 is provided below the first sidewall 121 described above in continuous with the first sidewall 121. The second sidewall 122 has a substantially cylindrical shape extending in the axis Z direction and forms the processing chamber 112. The etching apparatus 100 includes a mounting table 113 within the processing chamber 112. The mounting table 113 may support a wafer 101 that is an object to be processed on its upper surface. The mounting table 113 is supported by a support 114 extending in the axis Z direction from the bottom portion 123 of the processing container 110. The mounting table 113 includes a suction holding mechanism, such as an electrostatic chuck, a refrigerant flow passage connected to a chiller unit or the like, and a temperature control mechanism, such as a heater (neither of which is illustrated).

An exhaust pipe 142 leading to the processing chamber 112 is inserted in the bottom portion 123 of the processing container 110. A pressure regulator 143 and a pressure reducing pump 144 are connected to the exhaust pipe 142. The pressure regulator 143 and the pressure reducing pump 144 constitute an exhaust apparatus. By operating the pressure regulator 143 and the pressure reducing pump 144 and adjusting the flow rate of the gas supplied to the plasma generation chamber 111 and the flow rate of the gas supplied to the processing chamber 112, the pressure of the plasma generation chamber 111 and the pressure of the processing chamber 112 can be adjusted.

A shielding member 170 is provided between the plasma generation chamber 111 and the processing chamber 112. The shielding member 170 is formed of a substantially disk-shaped member, and in the shielding member 170, a plurality of openings 171 are formed to communicate the plasma generation chamber 111 and the processing chamber 112. The shielding member 170 is electrically isolated from the first sidewall 121 and the second sidewall 122.

The shielding member 170 has shielding properties to ultraviolet rays generated in the plasma generation chamber 111. That is, the shielding member 170 is made of a material that is impermeable to ultraviolet rays. The shielding member 170 is preferably made of a material that does not easily oxidize.

A bias power supply 182 may be connected to the shielding member 170 for applying bias electric power to the shielding member 170. The bias power supply 182 may be a high frequency power supply that generates high frequency bias power. The bias power supply 182 may be a DC power supply. Upon electric power being applied to the shielding member 170 by the bias power supply 182, plasma generated in the plasma generation chamber 111 is accelerated toward the shielding member 170. As a result, the speed of particles passing through the shielding member 170 is increased.

A DC power supply 183 may be connected to the electrode plate 131. A DC voltage applied to the electrode plate 131 by the DC power supply 183 can also accelerate the plasma generated in the plasma generation chamber 111 toward the shielding member 170.

The etching apparatus 100 includes such a configuration.

Figure 9:
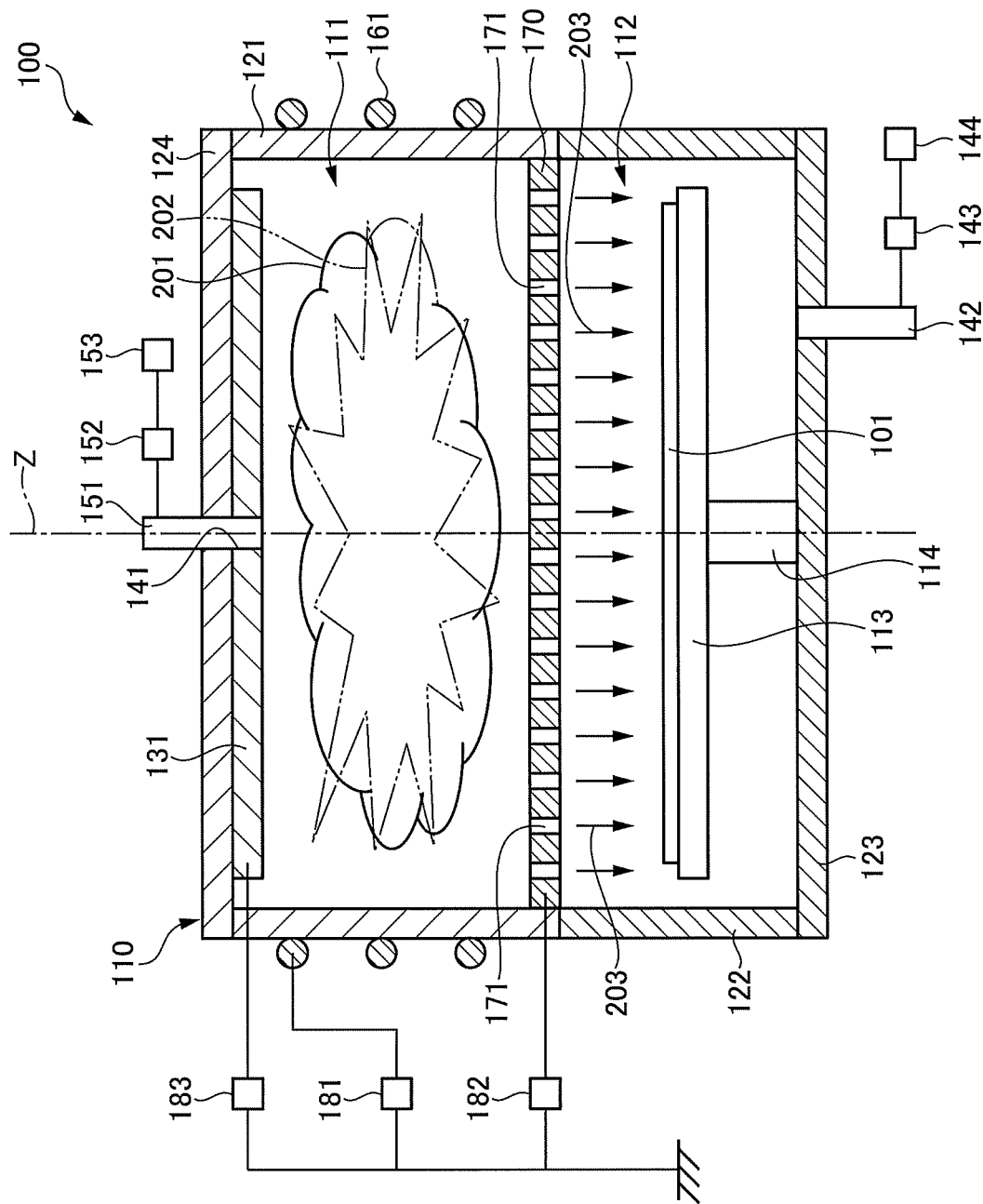
FIG. 9 is a schematic diagram illustrating a state in the etching apparatus at the time of an operation.

Here, an operation of the etching apparatus 100 will be described. FIG. 9 is a schematic diagram illustrating a state in the etching apparatus 100 at the time of an operation. As illustrated in FIG. 9, an etchant 201 is generated by plasma discharge of the first gas. The etchant 201 includes, for example, chloride ions or bromine ions. That is, the etchant 201 includes, for example, charged particles. At the time of plasma discharge, ultraviolet rays 202 are generated in the plasma generation chamber 111.

Also, the bias power supply 182 applies electric power to the shielding member 170. As a result, particles of the etchant 201 generated in the plasma generation chamber 111 are accelerated toward the shielding member 170 and the speed of particles passing through the shielding member 170 is increased. The particles of the etchant 201 contact the inner wall surfaces of the openings 171 at the time of passing through the openings 171 and are charged and neutralized from the shielding member 170 to which electric power is applied by the bias power supply 182. That is, by passing through the shielding member 170, the particles of the etchant 201 become electrically neutral particles. The particles of the etchant 201 are then controlled to move in the axis Z direction by the openings 171 and are discharged to the processing chamber 112, as illustrated by the arrows 203 in FIG. 9. A series of steps as described above from application of electric power to the shielding member 170, acceleration of the particles of the etchant 201 to the shielding member 170, passage of the particles of the etchant 201 through the openings 171 of the shielding member 170, to release of the particles of the etchant 201 to the processing chamber 112 is referred to as neutralizing particles in the present disclosure.

As described above, at the time of plasma discharge of the first gas, the ultraviolet rays 202 are generated in the plasma generation chamber 111. The ultraviolet rays 202 have energy corresponding to its wavelength, and upon the cap layer 18 being exposed to the opening 52X, the ultraviolet rays 202 may enter to a depth of several tens of nm to several hundreds of nm from the surface of cap layer 18, and, for example, may break chemical bonds between Ga atoms and N atoms. As a result, not only $GaCl_3$ or $GaBr_3$ is generated as a gallium compound on the upper surface 18A of the cap layer 18, but also a compound other than $GaCl_3$ or $GaBr_3$ is inevitably formed at a portion deeper than the upper surface 18A. It is difficult to identify the characteristics such as the saturated vapor pressure of this inevitably generated compound. Even when the protective film 26 is etched under the first atmosphere at a first pressure and the gallium compound is removed under the second atmosphere at a second pressure, the etching of the cap layer 18 may proceed.

With respect to the above, in the present embodiment, at the time of etching of the protective film 26, the shielding member 170 prevents the wafer 101 from being irradiated with the ultraviolet rays 202. Therefore, the generation of the compound due to the irradiation with the ultraviolet rays 202 is suppressed, and the progress of etching of the cap layer 18 is suppressed. That is, by $GaCl_3$ or $GaBr_3$ being generated as a gallium compound subsequent to the etching the protective film 26, a high etching selectivity ratio can be obtained between the protective film 26 and the cap layer 18 under the first atmosphere at the first pressure.

Also, such a gallium compound can also be easily removed under the second atmosphere. Therefore, while chlorine atoms or bromine atoms are an impurity that is not intentionally added, it is possible to suppress the residue of such an impurity in the vicinity of the gate electrode 28 and to suppress changes in characteristics such as fluctuation in the threshold voltage of the semiconductor device 1.

In the present embodiment, when the charged particles of the etchant 201 pass through the openings 171 of the shielding member 170, the charged particles contact the inner wall surfaces of the openings 171 and pass through the shielding member 170. Thereby, the particles become electrically neutral particles and are released to the processing chamber 112 while being controlled to move in the axis Z direction. Accordingly, the kinetic energy of the etchant 201 reaching the wafer 101 can be easily controlled with high accuracy. In a case in which the kinetic energy of the etchant 201 is excessive, even when the irradiation with the ultraviolet rays 202 is prevented, a compound other than $GaCl_3$ or $GaBr_3$ may be generated at a portion deeper than the upper surface 18A. However, the neutral particularized etchant 201 is not subject to external forces due to an external electric field and a magnetic field and thus can be controlled to a constant speed. As a result, the kinetic energy of the particles irradiated on the upper surface 18A of the cap layer 18, which is, for example, a GaN layer, is limited, and excessive energy that enters inside of the cap layer 18 can be suppressed. Accordingly, the range where a reaction occurs is limited to the upper surface 18A of the cap layer 18 such that the generation of a compound as described above is suppressed. Therefore, a higher etching selectivity ratio can be obtained between the protective film 26 and the cap layer 18 under the first atmosphere at the first pressure. In the present disclosure, the shielding member 170 serves as a filter that prevents the irradiation with the ultraviolet rays 202, a filter that applies electric charge to neutralize the charged particles of the etchant 201, or a filter that controls the electrically neutral particles to move in the axis Z direction.

Next, a method of forming the opening 26X using the etching apparatus 100 will be described.

First, a wafer 101 is housed in the processing chamber 112 and mounted on the mounting table 113. The wafer 101 includes, for example, a substrate 10, a layered structure 20, a protective film 26, and a photoresist 52 on which an opening 52X has been formed. Then, the first gas containing chlorine atoms or bromine atoms is supplied from the gas source 153 to the plasma generation chamber 111, and the pressure regulator 143 and the pressure reducing pump 144 are operated to adjust the atmosphere of the plasma generation chamber 111 and the processing chamber 112 to be the first atmosphere having the first pressure. The first pressure is lower than the first saturated vapor pressure of a silicon compound containing silicon atoms and chlorine atoms or bromine atoms contained in the first gas, which is, for example, $SiCl_4$ or $SiBr_4$. Also, the first pressure is higher than the second saturated vapor pressure of a gallium compound containing gallium atoms and chlorine atoms or bromine atoms contained in the first gas, which is, for example, $GaCl_3$ or $GaBr_3$.

For example, in a case in which the first gas contains chlorine atoms, the first atmosphere is set to an atmosphere having a first pressure lower than the first saturated vapor pressure of $SiCl_4$ and higher than the second saturated vapor pressure of $GaCl_3$. For example, in a case in which the first gas contains bromine atoms, the first atmosphere is set to an atmosphere having a first pressure lower than the first saturated vapor pressure of $SiBr_4$ and higher than the second saturated vapor pressure of $GaBr_3$. For example, the first pressure can be set to 0.1 Pa or more and 10 Pa or less. The etchant is easily generated by setting the first pressure to 0.1 Pa or more and 10 Pa or less. The first pressure may be set to 0.3 Pa or more and 8 Pa or less. Because the saturated vapor pressure depends on the temperature, the temperature control mechanism of the mounting table 113 may be used to control the temperature of the wafer 101.

Figure 10:
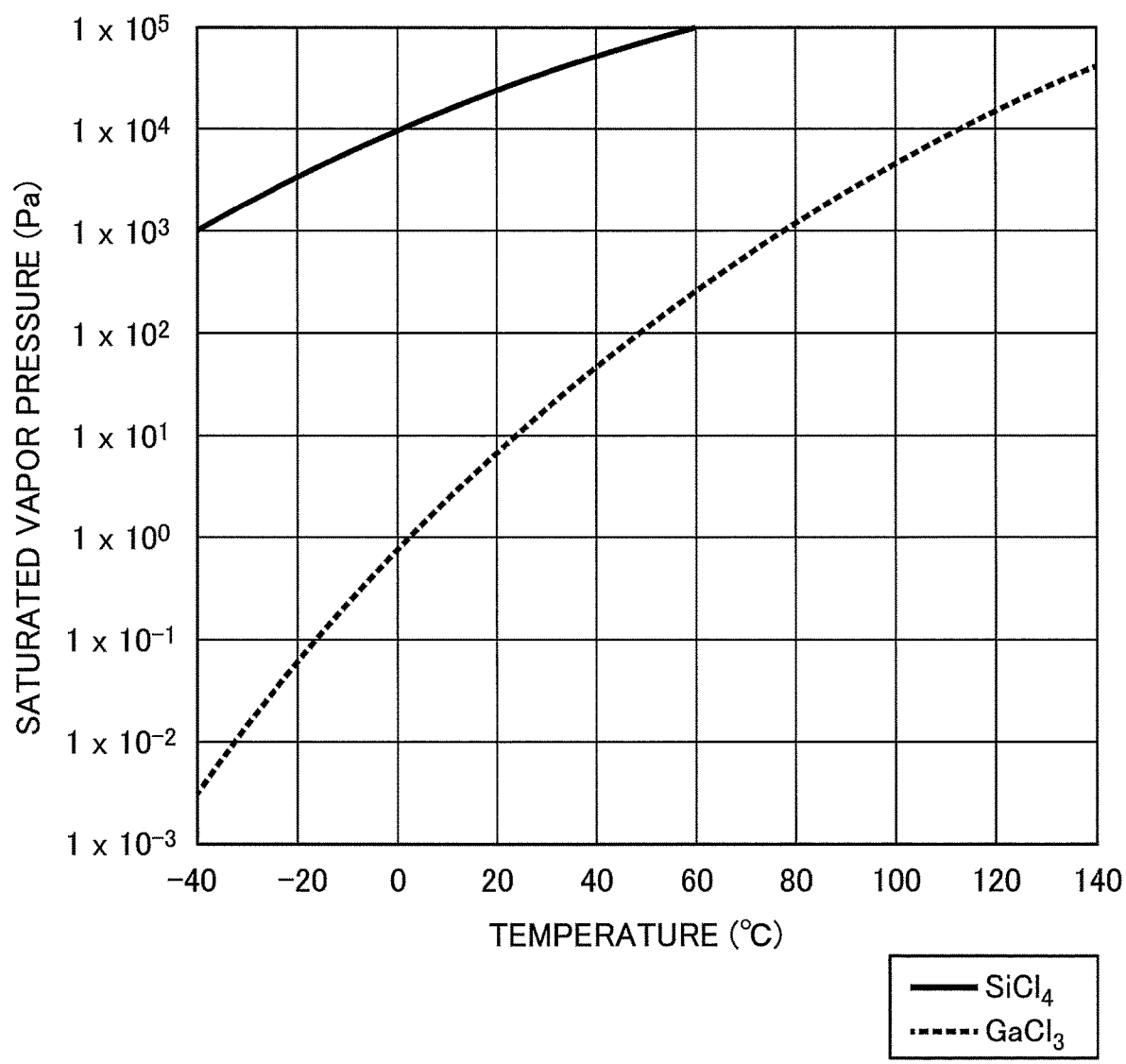
FIG. 10 is a diagram illustrating saturated vapor pressure curves of $SiCl_4$ and $GaCl_3$.

FIG. 10 is a diagram illustrating saturated vapor pressure curves of $SiCl_4$ and $GaCl_3$. The horizontal axis of FIG. 10 indicates the temperature and the vertical axis indicates the saturated vapor pressure. In FIG. 10, the solid line indicates the saturated vapor pressure curve of $SiCl_4$ and the broken line indicates the saturated vapor pressure curve for $GaCl_3$. In a case in which the first gas contains chlorine atoms, a pressure between the solid line and the broken line in FIG. 10 can be selected as the first pressure. For example, when the temperature is 0° C., a pressure in the range of approximately 0.9 Pa or more and 9000 Pa or less can be selected as the first pressure. Depending on the temperature, as described above, the first pressure may be 0.1 Pa or more and 10 Pa or less.

Figure 11:
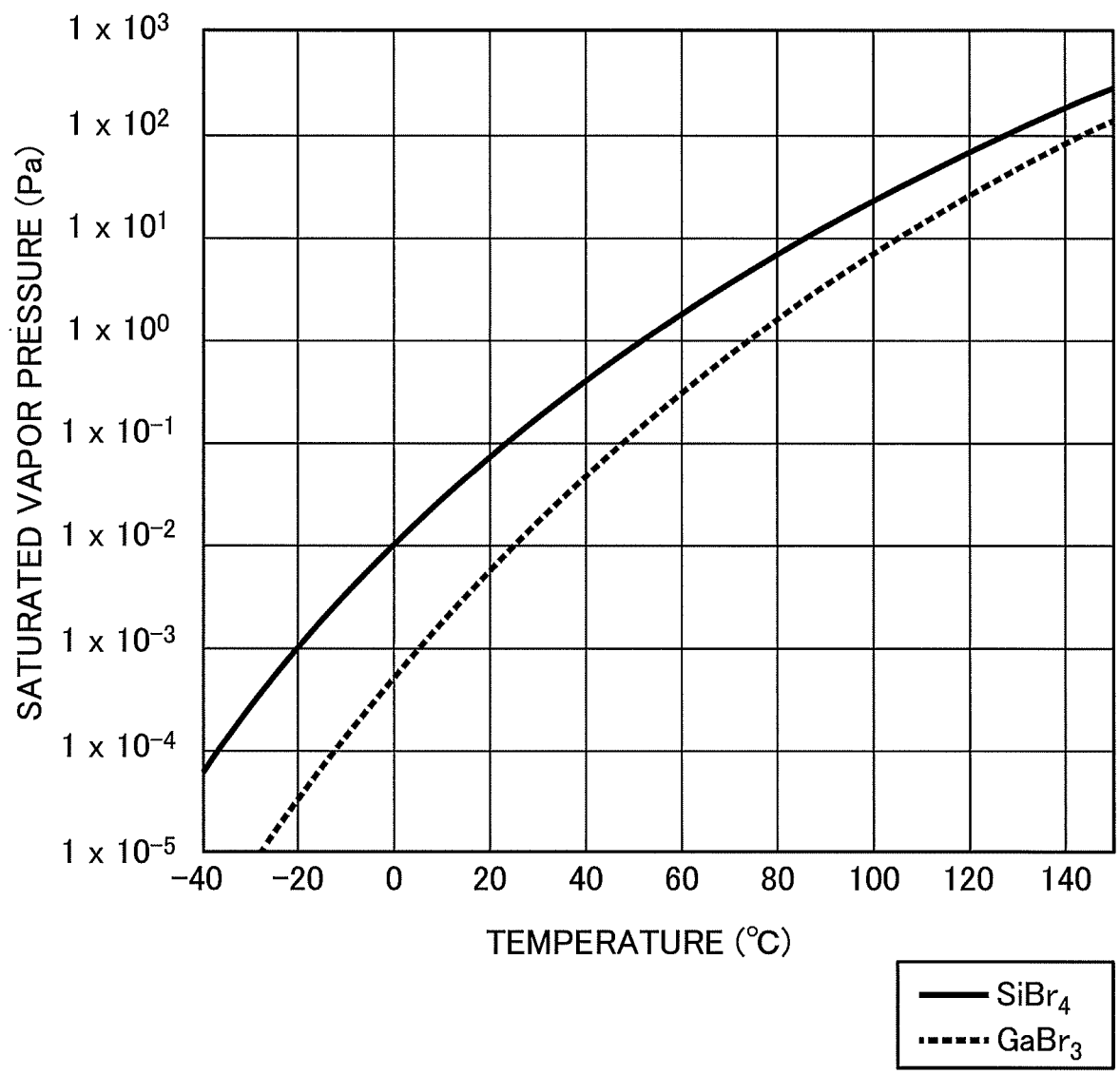
FIG. 11 is a diagram illustrating saturated vapor pressure curves of $SiBr_4$ and $GaBr_3$.

FIG. 11 is a diagram illustrating saturated vapor pressure curves of $SiBr_4$ and $GaBr_3$. The horizontal axis of FIG. 11 indicates the temperature and the vertical axis indicates the saturated vapor pressure. In FIG. 11, the solid line indicates the saturated vapor pressure curve of $SiBr_4$, and the broken line indicates the saturated vapor pressure curve for $GaBr_3$. In a case in which the first gas contains bromine atoms, a pressure between the solid line and the broken line in FIG. 11 can be selected as the first pressure. For example, when the temperature is 50° C., a pressure in the range of approximately 0.2 Pa or more and 0.8 Pa or less can be selected as the first pressure. Depending on the temperature, as described above, the first pressure may be 0.1 Pa or more and 10 Pa or less.

As illustrated in FIG. 10 and FIG. 11, the range of the first pressure that can be selected in a case in which the first gas contains chlorine atoms is wider than that in a case in which the first gas contains bromine gas. Also, in a case in which the first gas contains bromine gas, the first pressure can be set to 0.1 Pa or more and 10 Pa or less at a temperature closer to room temperature than in a case in which the first gas contains chlorine atoms.

FIG. 12 to FIG. 15 are cross-sectional views illustrating changes in the protective film 26 and the cap layer 18 at the time of forming the opening 26X.

Figure 12:
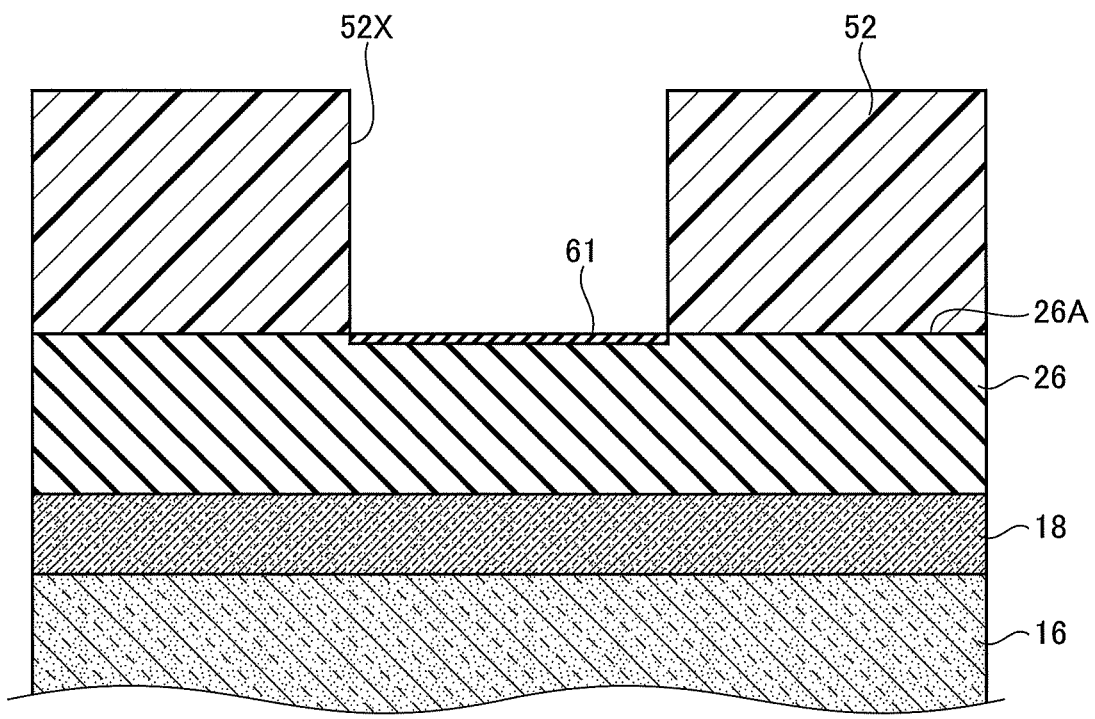
FIG. 12 is a cross-sectional view (part 1) illustrating a change in a protective film and a cap layer when forming an opening.
Figure 13:
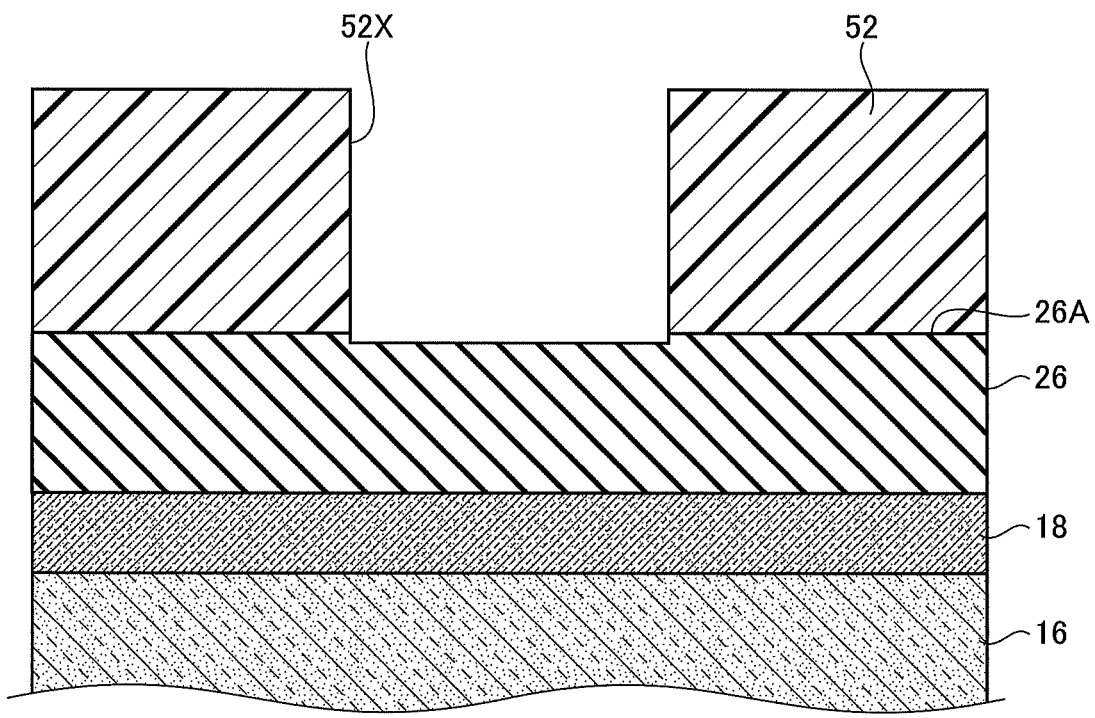
FIG. 13 is a cross-sectional view (part 2) illustrating a change in the protective film and the cap layer when forming the opening.

As described above, upon the particles of the etchant 201 being released into the processing chamber 112, as illustrated in FIG. 12, the particles of the etchant 201 collide with the portion of the protective film 26 exposed to the opening 52X. Then, a silicon compound 61 containing silicon atoms contained in the protective film 26 and chlorine atoms or bromine atoms contained in the first gas is generated on the upper surface 26A of the protective film 26. At this time, the first pressure of the first atmosphere is lower than the first saturated vapor pressure of the silicon compound 61. Thus, the silicon compound 61 vaporizes quickly and the silicon compound 61 is removed from the upper surface 26A of the protective film 26, as illustrated in FIG. 13. The generation and vaporization of the silicon compound 61 as described is repeated and the etching of the protective film 26 proceeds.

It should be noted that because the shielding member 170 is arranged between the plasma generation chamber 111 and the processing chamber 112, entry of the ultraviolet rays 202 generated in the plasma generation chamber 111 into the processing chamber 112 is suppressed. That is, the shielding member 170 prevents the wafer 101 from being irradiated with the ultraviolet rays 202.

Figure 14:
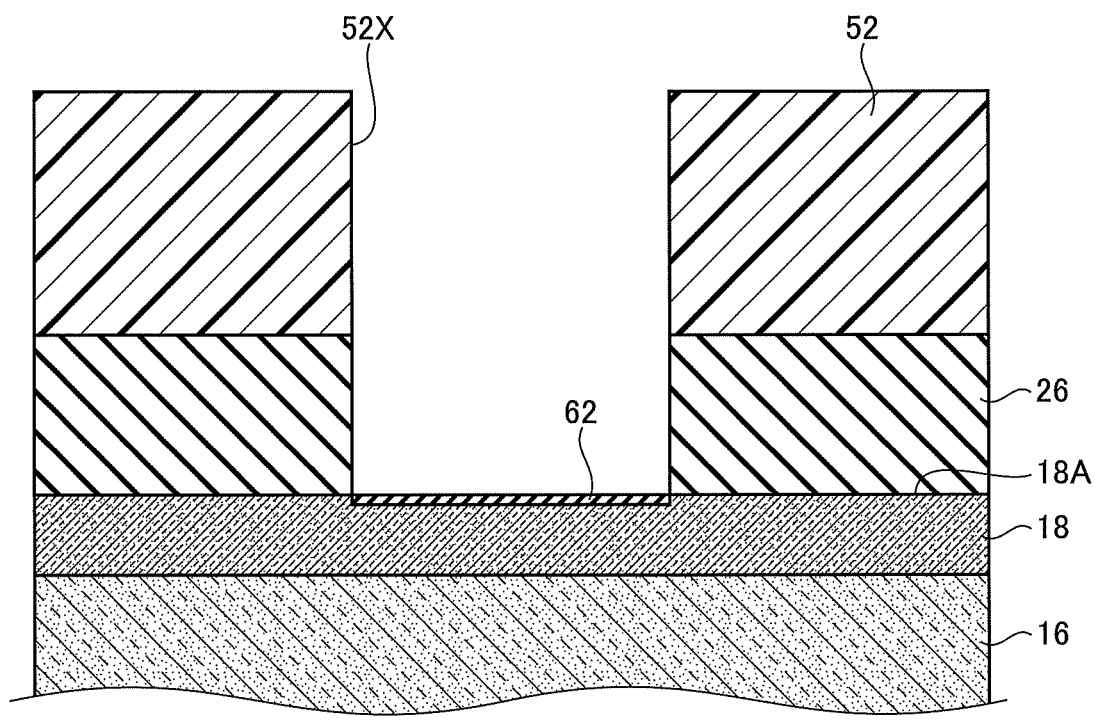
FIG. 14 is a cross-sectional view (part 3) illustrating a change in the protective film and the cap layer when forming the opening.

Upon all the portion of the protective film 26 exposed to the opening 52X being removed, the cap layer 18 is exposed to the opening 52X, as illustrated in FIG. 14. Then, the particles of the etchant 201 collide with the portion of the cap layer 18 that is exposed to the opening 52X, and a gallium compound 62 containing gallium atoms contained in the cap layer 18 and chlorine atoms or bromine atoms contained in the first gas is generated on the upper surface 18A of the cap layer 18. At this time, the first pressure of the first atmosphere is higher than the first saturated vapor pressure of the gallium compound 62. Thus, the gallium compound 62 remains without being vaporized and the etching of the cap layer 18 does not proceed. That is, the cap layer 18 serves as an etching stopper of a high selectivity ratio with respect to the protective film 26.

Then, the supply of the first gas containing chlorine atoms or bromine atoms from the gas source 153 is stopped, and the pressure regulator 143 and the pressure reducing pump 144 are operated to adjust the atmosphere of the plasma generation chamber 111 and the processing chamber 112 to be the second atmosphere having the second pressure. The second pressure is lower than the second saturated vapor pressure.

For example, in a case in which the first gas contains chlorine atoms, the second atmosphere is set to an atmosphere having a second pressure lower than the second saturated vapor pressure of $GaCl_3$. For example, in a case in which the first gas contains bromine atoms, the second atmosphere is set to an atmosphere having a second pressure lower than the second saturated vapor pressure of $GaBr_3$. For example, the second pressure can be set to $1\times10^{-3}$ Pa or less. Because the saturated vapor pressure depends on the temperature, the temperature control mechanism of the mounting table 113 may be used to control the temperature of the wafer 101.

In a case in which the first gas contains chlorine atoms, as the second pressure, a pressure that is lower than the broken line (saturated vapor pressure curve of $GaCl_3$) in FIG. 10 can be selected. For example, when the temperature is 0° C., a pressure of less than approximately 1.0 Pa can be selected. As described above, the second pressure may be $1\times10^{-3}$ Pa or less.

In a case in which the first gas contains bromine atoms, as the second pressure, a pressure lower than the broken line (saturated vapor pressure curve of $GaBr_3$) in FIG. 11 can be selected. For example, when the temperature is 50° C., a pressure of less than approximately 0.2 Pa can be selected as the second pressure. As described above, the second pressure may be set to $1\times10^{-3}$ Pa or less.

Figure 15:
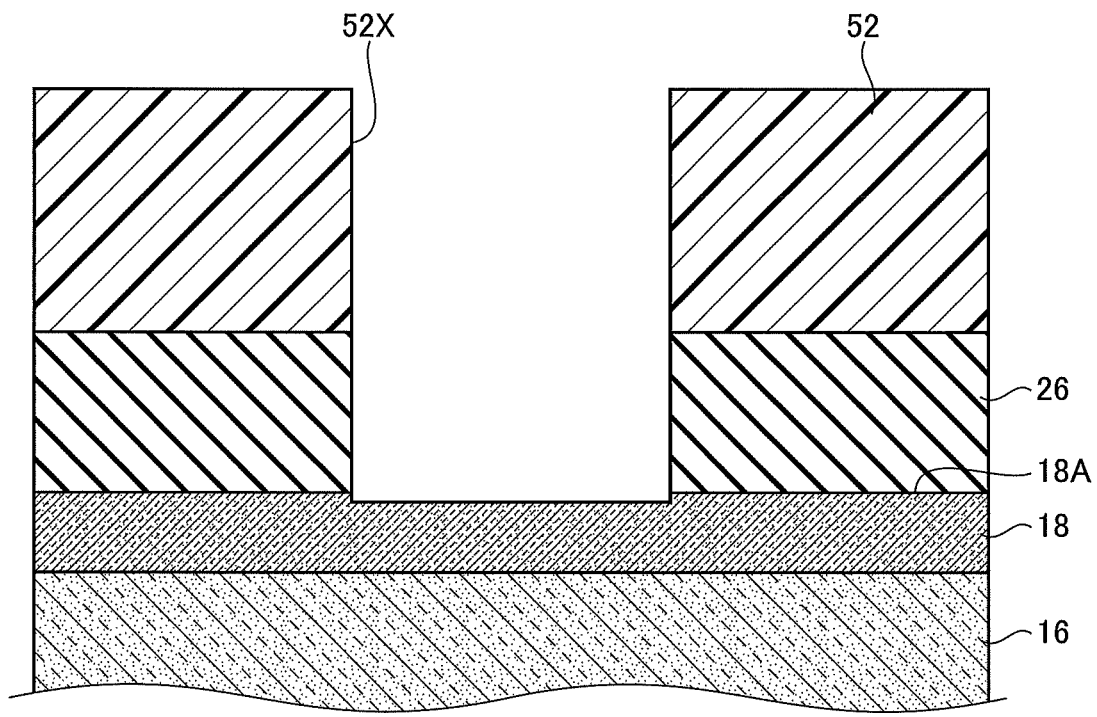
FIG. 15 is a cross-sectional view (part 4) illustrating a change in the protective film and the cap layer when forming the opening.

Upon the atmosphere of the plasma generation chamber 111 and the processing chamber 112 being adjusted to be the second atmosphere of the second pressure, because the second pressure of the second atmosphere is lower than the second saturated vapor pressure of the gallium compound 62, the gallium compound 62 vaporizes. As a result, the gallium compound 62 is removed from the upper surface 18A of the cap layer 18 as illustrated in FIG. 15.

Thereafter, the wafer 101 is detached from the mounting table 113 and is taken out moved from the processing chamber 112.

In this manner, the opening 26X can be formed.

As illustrated in FIG. 5, before the state in which another photoresist 52 is applied on the layered structure 20 and the protective film 26 is selectively removed with the photoresist 52 as a mask, the total thickness of the layered structure of the electron supply layer 16 and the cap layer 18 is preferably 100 nm or less. It is for obtaining high output at high frequency. The layered structure of the electron supply layer 16 and the cap layer 18 is an example of a second nitride layer. Also, the protective film 26 is an example of a second nitride layer.

Although the embodiment has been described in detail above, the embodiment is not limited to a specific embodiment, and various modifications and changes can be made within the scope of the claims.

DESCRIPTION OF THE REFERENCE NUMERALS

1: semiconductor device
10: substrate
12: nucleation layer
14: electron transport layer
16: electron supply layer
18: cap layer
18A: upper surface
20: layered structure
22: source electrode
23: metal
24: drain electrode
26: protective film
26A: upper surface
26X: opening
28: gate electrode
30: insulating film
30X: opening
50: photoresist
50X: opening
51: photoresist
51X: opening
52: photoresist
52X: opening
61: silicon compound
62: gallium compound
100: etching apparatus 101: wafer
110: processing container
111: plasma generation chamber
112: processing chamber
113: mounting table
114: support
121: first sidewall
122: second sidewall
123: bottom portion
124: lid portion
131: electrode plate
141: hole
142: exhaust pipe
143: pressure regulator
144: pressure reducing pump
151: pipe
152: flow controller
153: gas sauce
161: coil
170: shielding member
171: opening
181: high frequency power supply
182: bias power supply
183: DC power supply
201: etchant
202: ultraviolet rays
203: arrow

What is claimed is:

1. A method of manufacturing a semiconductor device including a substrate; a first nitride layer containing gallium on the substrate; and a second nitride layer containing silicon on the first nitride layer, the method comprising:
generating an etchant of a gas containing chlorine atoms or bromine atoms; and
selectively removing the second nitride layer with respect to the first nitride layer by the etchant,
wherein in the generating the etchant, the etchant is generated by plasma discharge of the gas,
wherein in the selectively removing the second nitride layer, the second nitride layer and the first nitride layer are prevented from being irradiated with ultraviolet rays generated at a time of the plasma discharge, and
wherein the selectively removing the second nitride layer includes etching the second nitride layer under a first atmosphere at a first pressure that is lower than a first saturated vapor pressure of a silicon compound containing silicon atoms and chlorine atoms or bromine atoms contained in the gas and that is higher than a second saturated vapor pressure of a gallium compound containing gallium atoms and chlorine atoms or bromine atoms contained in the gas.

2. The method of manufacturing a semiconductor device according to claim 1, wherein when the gas contains chlorine atoms, the gallium compound is $GaCl_3$.

3. The method of manufacturing a semiconductor device according to claim 1, wherein when the gas contains bromine atoms, the gallium compound is $GaBr_3$.

4. The method of manufacturing a semiconductor device according to claim 1, wherein the first pressure is set to 0.1 Pa or more and 10 Pa or less in the selectively removing the second nitride layer.

5. The method of manufacturing a semiconductor device according to claim 1,
wherein the generating the etchant includes
generating particles charged by plasma discharge of the gas; and
electrically neutralizing the particles.

6. The method of manufacturing a semiconductor device according to claim 5, wherein the generating the etchant includes controlling a moving direction of the electrically neutralized particles by a filter.

7. The method of manufacturing a semiconductor device according to claim 1,
wherein in the selectively removing the second nitride layer, the gallium compound is generated on a surface of the first nitride layer on the second nitride layer side subsequent to the etching the second nitride layer, and
wherein the selectively removing the second nitride layer includes removing the gallium compound under a second atmosphere at a second pressure that is lower than the second saturated vapor pressure.

8. The method of manufacturing a semiconductor device according to claim 1, wherein the selectively removing the second nitride layer includes forming an opening on the second nitride layer where the first nitride layer is exposed.

9. The method of manufacturing a semiconductor device according to claim 8, further comprising:
forming, in the opening, an electrode that contacts the first nitride layer.

10. The method of manufacturing a semiconductor device according to claim 1, wherein a thickness of the second nitride layer is 100 nm or less before the selectively removing the second nitride layer.

11. A method of manufacturing a semiconductor device, the method comprising:
forming a first nitride layer containing gallium on a substrate;
forming a second nitride layer containing silicon on the first nitride layer;
generating an etchant of a gas containing chlorine atoms or bromine atoms;
selectively removing the second nitride layer with respect to the first nitride layer by the etchant and forming an opening on the second nitride layer where the first nitride layer is exposed; and
forming, in the opening, an electrode that contacts the first nitride layer,
wherein the generating the etchant includes
generating particles charged by the plasma discharge of the gas; and
electrically neutralizing the particles; and
controlling a moving direction of the electrically neutralized particles by a filter,
wherein in the selectively removing the second nitride layer, the second nitride layer and the first nitride layer are prevented by the filter from being irradiated with ultraviolet rays generated at a time of the plasma discharge, and
wherein the selectively removing the second nitride layer includes
etching the second nitride layer under a first atmosphere at a first pressure that is lower than a first saturated vapor pressure of $SiCl_4$ or $SiBr_4$ containing silicon atoms and chlorine atoms or bromine atoms contained in the gas and that is higher than a second saturated vapor pressure of $GaCl_3$ or $GaBr_3$ containing gallium atoms and chlorine atoms or bromine atoms contained in the gas; and
removing, under a second atmosphere at a second pressure that is lower than the second saturated vapor pressure, $GaCl_3$ or $GaBr_{3g}$ generated on a surface of the first nitride layer on the second nitride layer side subsequent to the etching the second nitride layer.

* * * * *